US006407638B1

(12) United States Patent
Migliavacca

(10) Patent No.: US 6,407,638 B1
(45) Date of Patent: Jun. 18, 2002

(54) LOW TEMPERATURE-CORRECTED VOLTAGE GENERATOR DEVICE

(75) Inventor: Paolo Migliavacca, Mauzac (FR)

(73) Assignee: STMicroelectronics S.A., Gentilly (FR)

( * ) Notice: Subject to any disclaimer, the term of this patent is extended or adjusted under 35 U.S.C. 154(b) by 43 days.

(21) Appl. No.: 09/702,967

(22) Filed: Oct. 31, 2000

(30) Foreign Application Priority Data

Nov. 15, 1999 (FR) ........................................... 99 14284

(51) Int. Cl.[7] ............................ H03F 3/04; H03F 3/45; G05F 3/16

(52) U.S. Cl. ....................... 330/289; 330/256; 323/313; 323/314

(58) Field of Search ................................ 330/256, 289; 323/313, 314

(56) References Cited

U.S. PATENT DOCUMENTS 4,190,796 A * 2/1980 Ishii ........................... 323/280
4,352,053 A * 9/1982 Oguchi et al. .............. 330/256
4,939,442 A 7/1990 Carvajal et al. ............ 323/281
5,291,122 A 3/1994 Audy ......................... 323/313
5,359,233 A 10/1994 Mumper et al. ......... 307/272.3
5,373,226 A 12/1994 Kimura ...................... 323/313
5,668,467 A * 9/1997 Pease ......................... 323/315
6,107,866 A 8/2000 Migliavacca ................ 327/539
6,121,824 A * 9/2000 Opris ......................... 323/313
6,150,872 A * 11/2000 McNeill et al. ............. 323/313

FOREIGN PATENT DOCUMENTS

EP 0 552 964 A2 7/1993 ............. G05F/3/30
FR 2 767 207 8/1997 ............. G05F/3/26

* cited by examiner

*Primary Examiner*—Robert Pascal
*Assistant Examiner*—Patricia T. Nguyen
(74) *Attorney, Agent, or Firm*—Lisa K. Jorgenson; Allen, Dyer, Doppelt, Milbrath & Gilchrist, P.A.

(57) ABSTRACT

The low temperature-corrected constant voltage generator device includes a reference voltage generator, an amplifier connected between the reference voltage generator and an output terminal and a voltage divider connected to an input of the amplifier in order to supply a feedback voltage to the amplifier. The divider includes at least one first resistor in series with an element having, at least in the low temperature range, an impedance with a temperature dependence behavior different from that of the first resistor, to supply a lower feedback in the low temperature range.

23 Claims, 4 Drawing Sheets

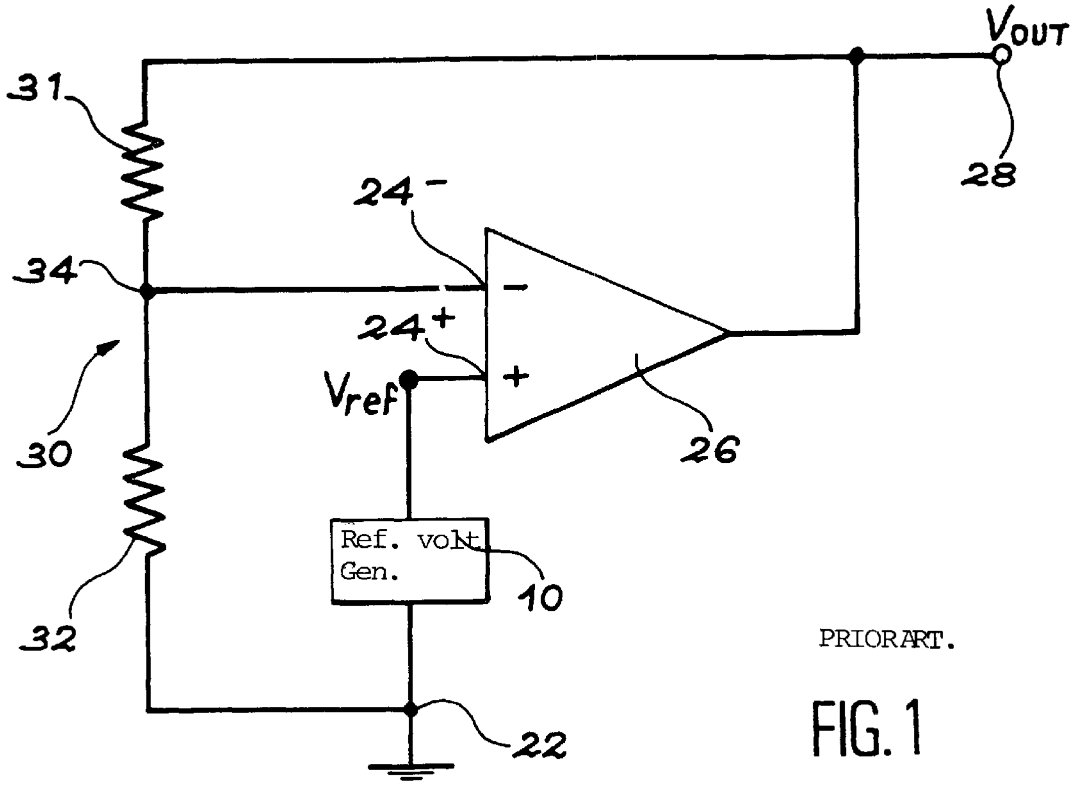
FIG. 1
FIG. 2
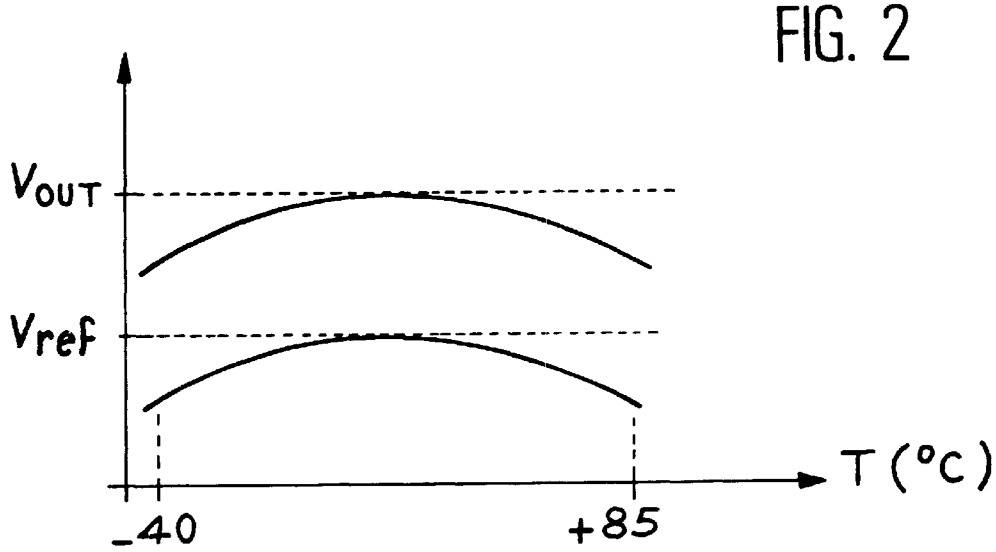

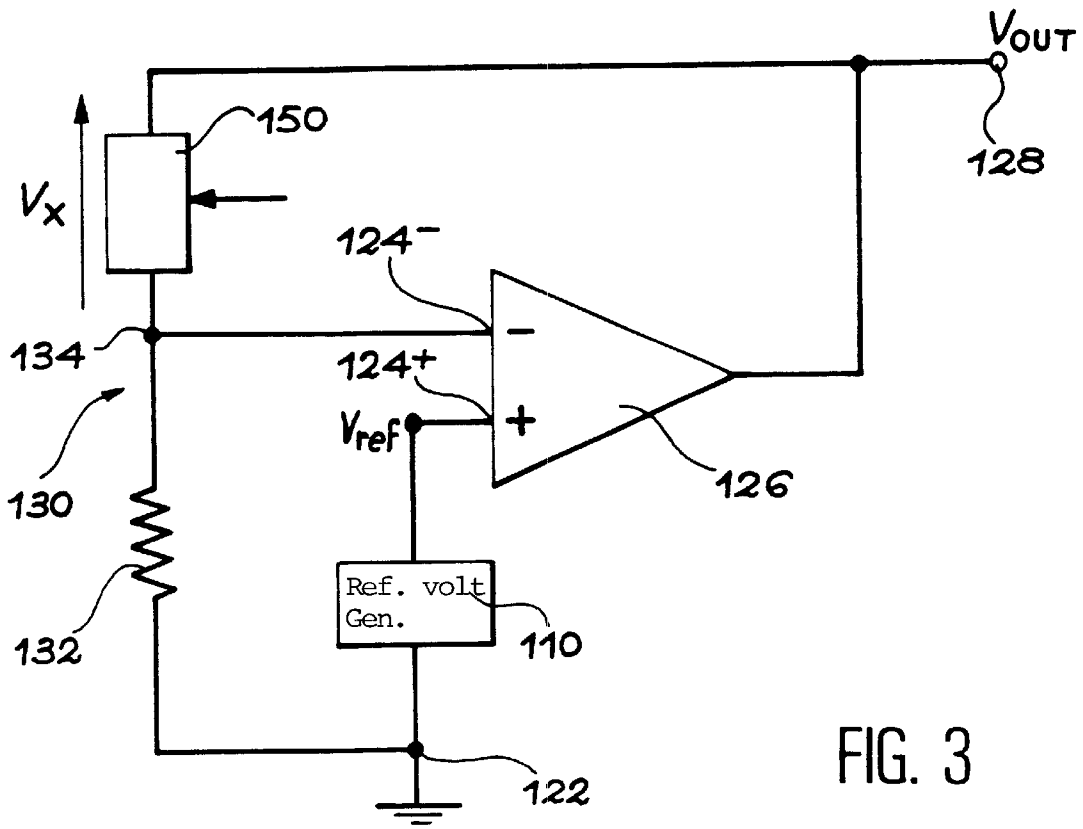
FIG. 3
FIG. 4
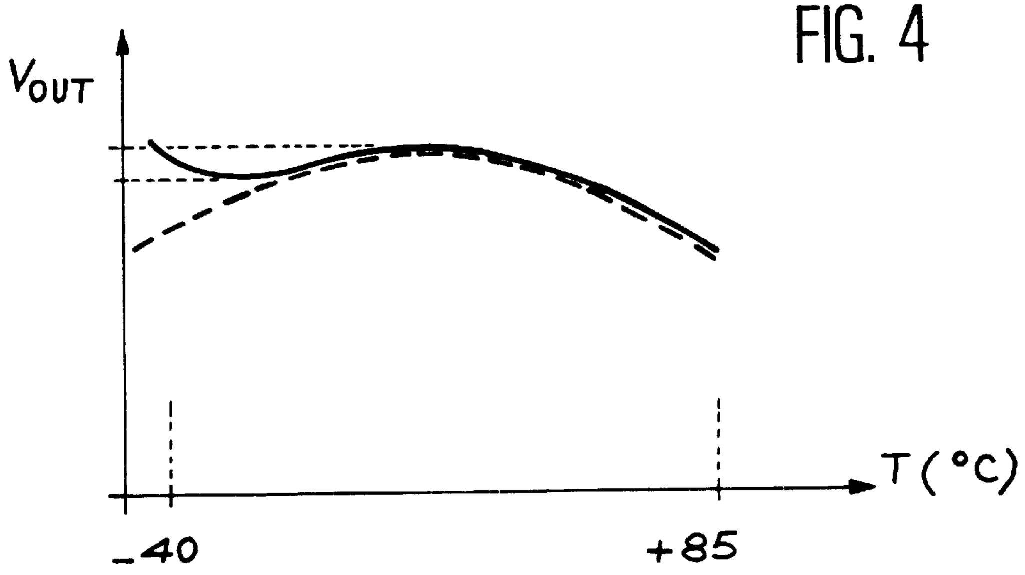

LOW TEMPERATURE-CORRECTED VOLTAGE GENERATOR DEVICE

FIELD OF THE INVENTION

The present invention relates to voltage generators, and more particularly, to a low temperature-corrected, constant voltage generator device including a reference voltage generator of the band gap type.

BACKGROUND OF THE INVENTION

Reference voltage generators and in particular those of the band gap type are not generally able to deliver high currents. In addition, the generators are frequently associated with an amplifier to form a device able to supply a higher current at a constant voltage. Such a device is diagrammatically illustrated in FIG. 1. In FIG. 1, reference numeral 10 designates a well known reference voltage generator of the band gap type, for example, as disclosed in FR-A-2 767 207 to the same inventors. The reference voltage generator 10 is connected between a ground terminal 22 and an amplifier input. In the case of FIG. 1, the amplifier 10 is connected to a noninverting input 24+ of an operational amplifier 26. Throughout the remainder of the text, the voltage delivered by the reference voltage generator 10 is designated $V_{REF}$. The voltage delivered by the complete constant voltage generator device is available in an output terminal 28 of the amplifier and is designated $V_{OUT}$.

A divider bridge 30 is formed by a first resistor 31 of value $R_1$ in series with a second resistor 32 of value $R_2$. It is connected between the output terminal 18 and the ground terminal 22. A node 34, between the first and second resistors, is connected to the noninverting input 24– of amplifier 26, to deliver there the divided voltage as the feedback voltage.

The available output voltage $V_{OUT}$ is such that:

$$V_{OUT} = V_{REF}\frac{R_1 + R_2}{R_2} \qquad \text{(equation (1))}$$

$$V_{OUT} = V_{REF}\left(1 + \frac{R_1}{R_2}\right)$$

The reference voltage generator 10 can be adjusted so that the voltage $V_{REF}$ is substantially constant with the temperature in a relatively wide temperature range. However, it is found that the reference voltage value $V_{REF}$ has a linearity fault or error due to a second order term of the temperature development, which is characterized by a so-called bell-shaped temperature behavior. This behavior is illustrated in FIG. 2, which indicates in an arbitrary scale, the value of the voltage $V_{REF}$ on the ordinate, as a function of the temperature on the abscissa.

It can be seen that the bell-shaped behavior is particularly illustrated by a negative inflexion of the voltage curve for low temperatures. Such an inflexion also occurs for high temperatures.

FIG. 2 also indicates the value of the output voltage $V_{OUT}$ of the complete device which, to within a translation, reproduces the bell-shaped behavior of the voltage $V_{REF}$. This behavior of the output voltage $V_{OUT}$ can be explained by the temperature identical evolution of the first and second resistors, which essentially have the same temperature coefficients. In other words, the ratio $$\frac{R_2}{R_1}$$

in the equation (1) remains constant no matter what the temperature.

The second order linearity error of the reference voltage generator ($V_{REF}$) and the output voltage ($V_{OUT}$) of the complete voltage generator device finally has repercussions on the equipment equipped with such a device and which are liable to operate, not only at ambient temperatures, but also in a low temperature range.

SUMMARY OF THE INVENTION

An object of the invention is to provide a voltage generator device for which the second order linearity error referred to above is corrected, particularly at low temperatures.

To achieve this an other objectives, the invention more specifically relates to a low temperature-corrected, constant voltage generator device comprising:

- a reference voltage generator having a second order linearity error in a low temperature range,
- an amplifier connected between the reference voltage generator and an output terminal,
- a voltage divider, connected to the output terminal and connected to an input of the amplifier to supply the latter with a feedback voltage.

According to the invention, the voltage divider comprises at least one first resistor in series with an element having, at least in the low temperature range, an impedance with a temperature dependence behavior different from that of the first resistor, so as to supply a lower feedback in the low temperature range and a stronger feedback outside the range. The element in series with the first resistor can be a passive element, such as e.g. a second resistor having a temperature coefficient different from that of the first resistor.

According to another embodiment, the voltage divider can also have at least one active element, whose characteristic with the temperature is different from that of the resistor. As a result of these characteristics, the voltage divider produces a feedback voltage which varies with the temperature and which makes it possible to partly or totally correct the bell-shaped behavior of the reference generator.

The value of the first resistor of the divider, like the characteristics of the reference voltage generator, can be adjusted so as to obtain an optimum correction. In particular, the slope and consequently the term of the first temperature dependence order of the reference voltage supplied by the reference voltage generator can be adjusted in such a way that the reference voltage is constant with the temperature, to within the second and third order linearity errors. The first resistor of the voltage divider can have a value adjusted as a function of the second order error of the reference voltage generator, to obtain at the output terminal a voltage which is quasi-constant with the temperature (only the third order remains).

According to an embodiment of the device in which the element in series with the first resistor is active, the latter can incorporate one or more bipolar transistors. The transistor or transistors are then connected in series with the first resistor of the voltage divider by the collector and emitter terminals. They are also polarized or biased to operate under saturation conditions for temperatures equal to or higher than-the temperatures of the low temperature range.

Although the active element can have several transistors in chain or parallel form, the following description relates to only one of these transistors for simplification reasons. The nonlinear temperature character of the bipolar transistor of which advantage is taken in the aforementioned embodiment is due to the fact that a bipolar transistor supplied with a constant collector current has a higher saturation when its operating temperature is higher. Ideally, the transistor can be polarized so as to be at the limit of the saturation conditions in the low temperature range and so as to be highly saturated when the temperature exceeds the low temperature range. The considered low temperature range is e.g. between −60 and +25° C. Other temperature ranges can be taken into account by correspondingly modifying the polarization of the transistor.

The polarization of the bipolar transistor can, e.g. make use of a current source, which is connected to its base and which fixes its operating point. When several transistors are used as the nonlinear element, the bases of all these transistors can be controlled by the power supply.

BRIEF DESCRIPTION OF THE DRAWINGS

Other features and advantages of the invention can be gathered from the following description with reference to the attached drawings and which is given in a purely illustrative and non-limitative manner.

FIG. 1, already described, is a simplified, diagrammatic representation of a prior art voltage generator device.

FIG. 2, already described, is a graph indicating on an arbitrary scale, the evolution of the voltage delivered by the reference voltage generator and by the complete device of FIG. 1, as a function of the temperature.

FIG. 3 is a diagrammatic representation of a voltage generator device according to the invention.

FIG. 4 is a graph indicating on an arbitrary scale the evolution of the voltage delivered by the device of FIG. 3.

DETAILED DESCRIPTION OF EMBODIMENTS

Figure 5:
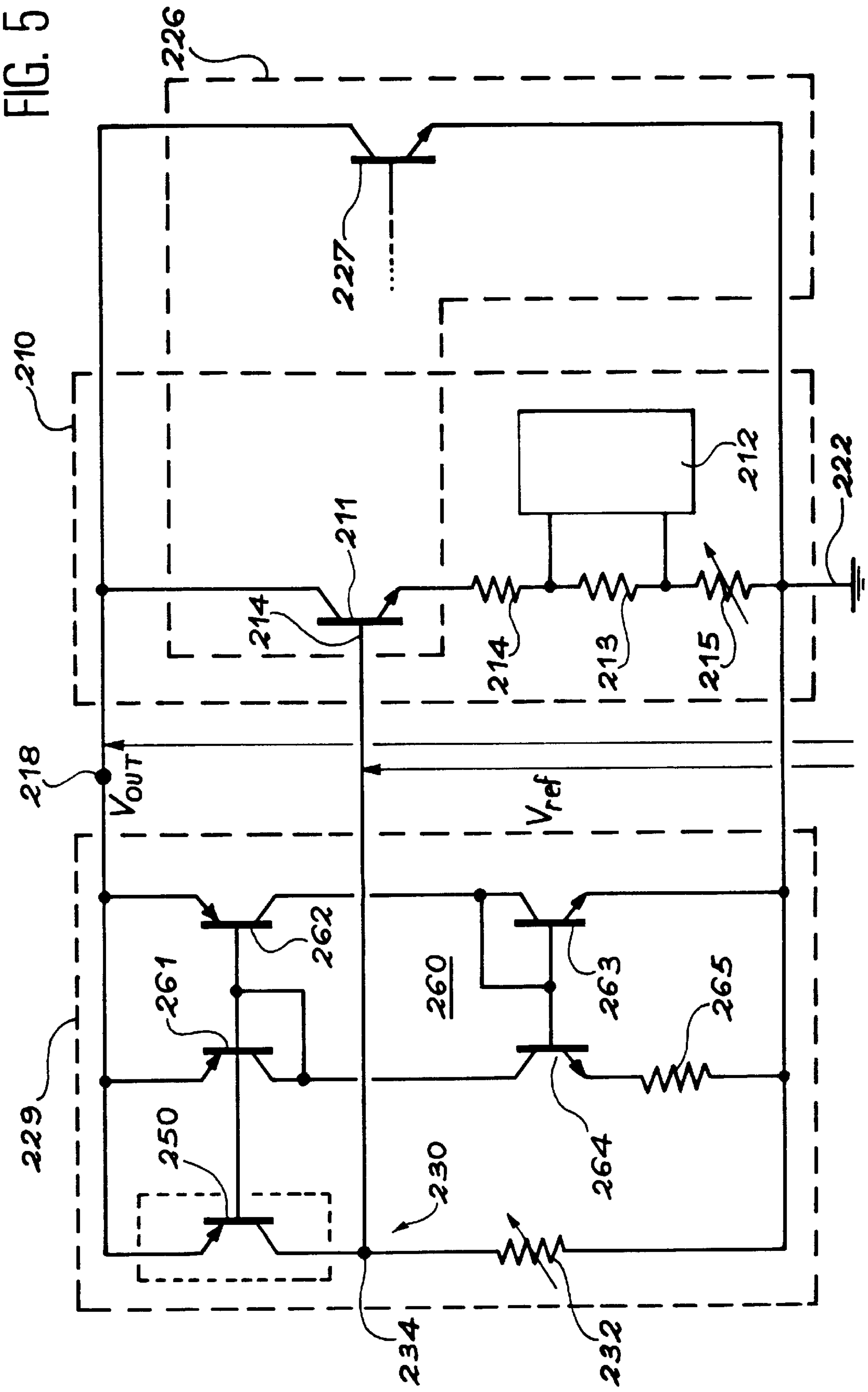
FIG. 5 is a simplified, diagrammatic representation of an embodiment of the device according to the invention.

The term band gap generator is understood to mean a generator having a substantially linear voltage and in particular constant with temperature. Such a generator takes advantage of a temperature dependence of the voltage existing at the terminals of one or more semiconductor junctions. The term band gap results from the fact that the voltage is a function of the bank gap width of the semiconductor or semiconductors. Like the band gap-type generators, the device according to the invention is used in the microelectronics and integrated electronics fields. For example, the device according to the invention can be used as a guide voltage generator for an analog-digital converter or for batteries and supply voltage supervisory systems. FIG. 3 shows in simplified form the main elements of a constant voltage generator device according to the invention. In FIG. 3 identical, similar or equivalent parts to those of FIG. 1 carry the same references but to which 100 has been added. Accordingly, no further detailed description of these parts is necessary and reference can be made to the preceding description relative to FIG. 1.

It is pointed out that the divider bridge 130 still has a first resistor 132 connecting the ground terminal 122 to the inverting input 124 of the amplifier 126. However, the first resistor is connected at a node 134 to an element 150, in series between the output terminal 128 and the ground terminal 122. According to the invention, the element 150 has an impedance with a temperature dependence behavior different from that of the first resistor. In the remainder of the text, the impedance of element 150 is designated $R_X$ and the voltage at its terminals $R_X$.

Considering that the amplifier 126 is an ideal, operational amplifier, it is possible to write:

$$V_{OUT}=V_{REF}+V_X$$

$$V_{OUT}=V_{REF}\left(1+\frac{R_X}{R_1}\right)$$

This expression is to be likened to equation (1) given in connection with FIG. 1.

However, it should be noted that unlike the ratio $R_2/R_1$ in equation (1), which remains constant, the ratio $R_X/R_1$ varies with the temperature due to the temperature dependence behavior difference. In particular, the value $R_X$ decreases less rapidly than the value $R_1$ when the temperature falls. The voltage $V_X$, supplied by the elements $R_X$ and $R_1$ also tends to decrease less rapidly when the temperature falls and in particular in a low temperature range, as will become apparent hereinafter.

This feedback contribution to the temperature behavior makes it possible to at least partly compensate the linearity error of the reference voltage generator 110. The compensation can be adjusted as a function of the reference generator 110, particularly by modifying the value $R_1$ of the first resistor 132. The temperature-developed reference voltage $V_{REF}$ (element 110), has a first order term and a second order term. The same applies for the voltage $V_X$ by reason of the ratio $R_X/R_1$. By acting on $R_1$, it is possible to modify the coefficients of the first and second orders (together)) of $V_X$ so as to compensation or cancel out the second order term of $V_{REF}$. (By acting on the variable resistor 215 of FIG. 5 described hereinafter, it is possible to act solely on the first order of $V_{REF}$ to compensate the first order of $V_X$).

FIG. 4 indicates on an arbitrary scale and as a function of the temperature, the output voltage $V_{OUT}$ delivered by the device of FIG. 3 at its output terminal 128. The output voltage is indicated by a continuous line. For comparison purposes, the output voltage delivered by a device according to FIG. 1 appears in broken line form. It should be noted that the device according to the invention makes it possible to maintain a substantially constant voltage in a low temperature range by correcting, for the temperatures, the bell-shaped behavior shown in FIG. 2.

In accordance with an example, variations of the voltage $V_{OUT}$ for a temperature excursion between−40° C. and 85° C. is approximately 3 mV with a prior art device according to FIG. 1, whereas the variation of $V_{OUT}$ can be limited to 1.5 mV with the device according to the invention shown in FIG. 3, for the same nominal output voltage value.

FIG. 5 described hereinafter corresponds to an embodiment of the device of FIG. 3, in which a nonlinear element is essentially formed by a pnp-type bipolar transistor. Equivalent elements to those of FIG. 3 carry the same references, but 100 has been added. The amplifier 226 is simply indicated with a transistor 227 which forms the output stage thereof. The input stage of the amplifier is formed by an input transistor 211 common to the amplification and to a reference voltage generator 210. The reference voltage generator incorporates a voltage generator 212 delivering a voltage $\Delta V_{BE}$ and at whose terminals is connected a first, reference resistor 213 having a value of $R_B$.

The voltage generator 212 is not described in detail here, because its structure is in itself know from the prior art, as would be appreciated by the skilled artisan. The generator 212 and the first reference 213 are in series with a second reference resistor 214 of value $R_A$ and a variable resistor 215 of value $R_C$. The resistors are connected between the emitter of the input transistor 211 and the ground terminal 222. The assembly formed by the voltage generator 212, resistors 213, 214, 215 and the transistor 211 form a band gap-type generator. The reference voltage $V_{REF}$ delivered by the reference voltage generator 210 is consequently such that:

$$V_{REF} = V_{BE211} + \Delta V_{BE}\frac{R_A + R_B + R_C}{R_B}$$

In this expression $V_{BE211}$ is the base-emitter voltage of the input transistor 211.

Thus, the voltage $V_{REF}$ is entirely defined by the polarization of the input transistor 211, which is dependent on the values of $\Delta V_{BE}$, $R_A$, $R_B$ and $R_C$. The temperature behavior of $V_{REF}$ can be modified by adjusting the value $R_C$ of the variable resistor 215. The behavior is substantially linear, to within the bell-shaped linearity errors. Reference numeral 229 designates in general terms a feedback loop, which connects the output terminal 218 of amplifier 226 to an input terminal 214 constituted by the base of the input transistor 211. The feedback loop 229 comprises a voltage divider 230 with a resistor 232 in series with a bipolar transistor 250, which here constitutes an active element with temperature dependence coefficients different from those of the resistor 232.

The emitter of transistor 250 is connected to the output terminal 218 and its collector is connected to the resistor 232 by a node 234, connected to the input 214 of amplifier 226. The resistor 232 connects the node 234 to the ground terminal 222. By acting on the value of $R_C$ and on the value of the resistor 232, it is possible to compensate, i.e. substantially cancel out the first and second terms of a temperature development of the output voltage $V_{OUT}$.

A power supply 260, constructed around four transistors 261, 262, 263, 264 and a resistor 265, is supplied between the output terminal 218 and the ground terminal. The power supply 260 is connected to the base of the bipolar transistor 250 in accordance with a current mirror-type arrange making it possible to fix a given base current. This current is fixed in order to make the transistor 250 operate under saturation conditions. The nonlinear character of the voltage $V_{CE}$ of the transistor is illustrated by parts A and B of FIG. 6, described hereinafter.

Part A indicates on the ordinate values of the collector current of transistor 250 of the voltage divider expressed in $10^{-6}$ ampere, as a function of the emitter-collector voltage ($V_{EC}$) expressed in volts. Three curves 301, 302, 303 are shown and respectively correspond to the characteristic of the transistor 250 for temperatures of −60, +50 and +160° C. Three operating points 311, 312 and 313 are considered for a current $I_C$ fixed by the power supply. It can be seen that the current $I_C$ is not strictly identical for the different temperatures. However, its variations are sufficiently low and linear to be neglected at a first approximation.

The operating points are fixed by the base current of the transistor, so that the operating point 311 at a temperature of −60° C. is at the limit of the saturation zone of transistor 250. The other operating points, corresponding to higher temperatures, are in strong saturation zones of the transistor.

Figure 6:
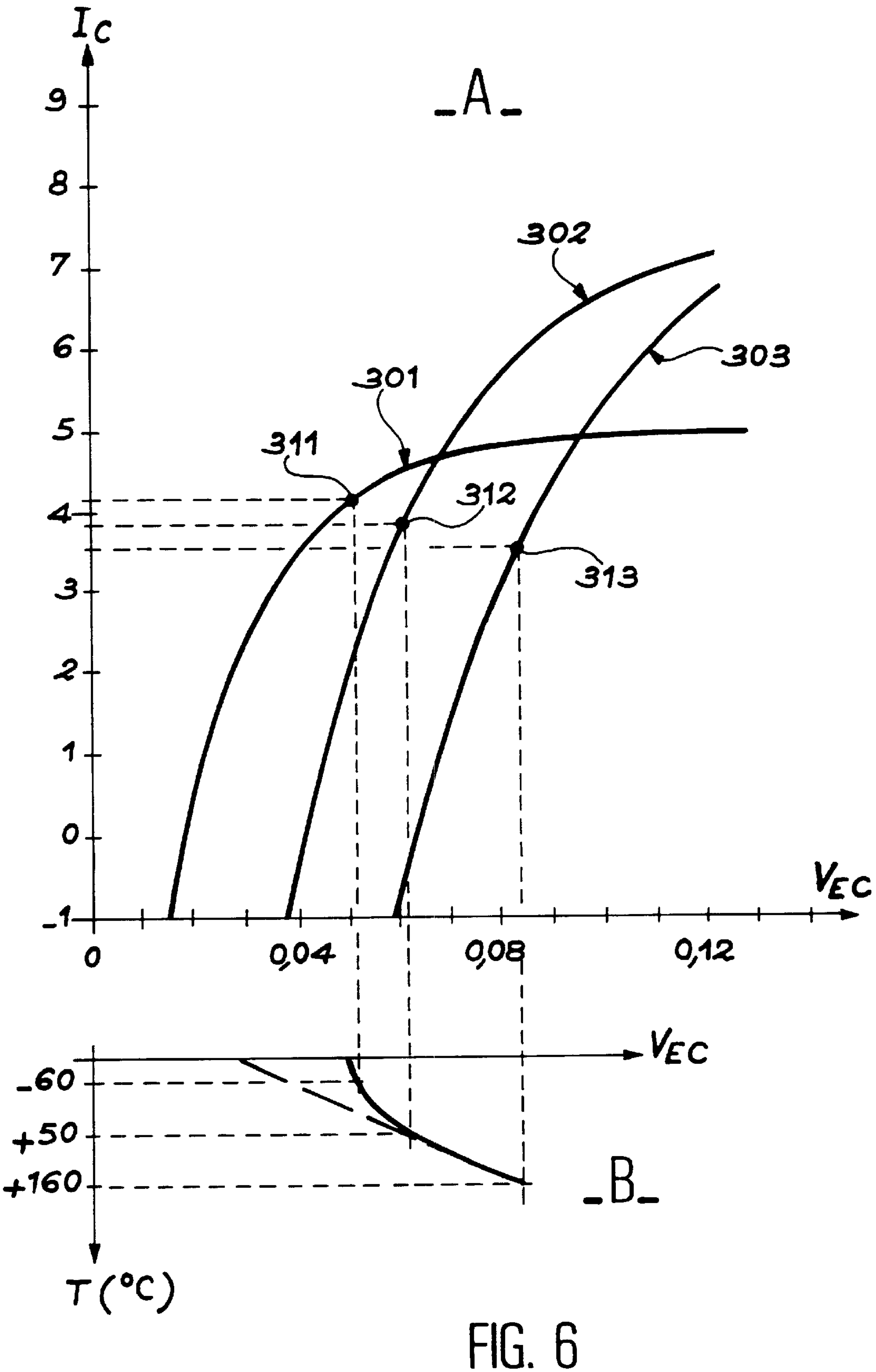
FIG. 6A is a graph indicating, for different temperatures, the characteristics of the collector current as a function of an emitter-collector voltage of a bipolar transistor used in the device of FIG. 5.
FIG. 6B is a graph indicating the variations of the emitter-collector voltage of the bipolar transistor of FIG. 5, as a function of its operating temperature.

Part B of FIG. 6 shows the evolution of the emitter-collector voltage ($V_{EC}$) of the transistor 250 as a function of the temperature. The scale of the voltages of part B is identical to that of part A and the voltages corresponding to the operating points 311, 312 and 313 are shown there. Part B of FIG. 6 reveals the nonlinear evolution of the voltage at the terminals of transistor 250 as a function of the temperature, for a current constant in a first approximation. This nonlinear evolution is advantageously used according to the invention for correcting the second order linearity error (i.e. the second order of the temperature development) of the reference voltage generator 210. This correction can be finely adjusted by modifying the values $R_1$ and $R_C$ of the first resistor in the voltage divider and in the reference voltage generator.

What is claimed is:

1. A low temperature-corrected voltage generator device comprising:

an output terminal;

a reference voltage generator having a linearity error in a low temperature range;

an amplifier connected between the reference voltage generator and the output terminal; and a voltage divider, connected to the output terminal and to an input of the amplifier for supplying the amplifier with a feedback voltage, the voltage divider comprising at least one first resistor connected in series with a circuit element having, at least in the low temperature range, an impedance with a temperature dependence behavior different from that of the first resistor to supply a lower feedback voltage in the low temperature range.

2. A device according to claim 1, wherein said circuit element is a second resistor with a temperature coefficient different from that of the first resistor.

3. A device according to claim 1, wherein said circuit element has, at least in the low temperature range, a nonlinear voltage behavior with the temperature.

4. A device according to claim 1, wherein the first resistor of the voltage divider has a value adjusted as a function of the linearity error of the reference voltage generator, so as to obtain a voltage substantially linear with the temperature at the output terminal.

5. A device according to claim 4, wherein the reference voltage generator delivers a voltage substantially linear with the temperature.

6. A device according to claim 1, wherein the circuit element comprises at least one bipolar transistor connected in series with the first resistor of the voltage divider, the at least one bipolar transistor being polarized so as to function under saturation conditions for temperatures equal to or higher than the temperatures of the low temperature range.

7. A device according to claim 6, further comprising a power supply connected to a base of the bipolar transistor for fixing an operating point of the transistor.

8. A device according to claim 1, wherein the low temperature range is between −60° C. and +25° C.

9. A low temperature-corrected voltage generator device comprising:

an output terminal;

a band-gap type reference voltage generator for generating a substantially constant reference voltage over a temperature range;

an amplifier connected between the reference voltage generator and the output terminal; and a voltage divider, connected to the output terminal and to the amplifier for supplying the amplifier with a feedback voltage, the voltage divider comprising a first resistor connected in series with a circuit element having, at least in a lower portion of the temperature range, an impedance with a temperature dependent behavior different from that of the first resistor to supply a lower feedback voltage in the lower portion of the temperature range.

10. A device according to claim 9, wherein said circuit element is a second resistor with a temperature coefficient different from that of the first resistor.

11. A device according to claim 9, wherein said circuit element has, at least in the lower portion of the temperature range, a nonlinear voltage behavior with the temperature.

12. A device according to claim 9, wherein the first resistor of the voltage divider has a value adjusted as a function of the linearity error of the reference voltage generator, so as to obtain a voltage substantially linear with the temperature at the output terminal.

13. A device according to claim 9, wherein the circuit element comprises at least one bipolar transistor connected in series with the first resistor of the voltage divider, the at least one bipolar transistor being polarized so as to function under saturation conditions for temperatures equal to or higher than the temperatures of the lower portion of the temperature range.

14. A device according to claim 13, further comprising a power supply connected to a base of the bipolar transistor for fixing an operating point of the transistor.

15. A device according to claim 9, wherein the lower portion of the temperature range is between −60° C. and +25° C.

16. A method of making a low temperature-corrected voltage generator device comprising:

providing a reference voltage generator having a linearity error in a low temperature range;

connecting an amplifier between the reference voltage generator and an output terminal; and connecting a voltage divider to the output terminal and to an input of the amplifier for supplying the amplifier with a feedback voltage, the voltage divider comprising at least one first resistor connected in series with a circuit element having, at least in the low temperature range, an impedance with a temperature dependence behavior different from that of the first resistor to supply a lower feedback voltage in the low temperature range.

17. A method according to claim 16, wherein the circuit element is a second resistor with a temperature coefficient different from that of the first resistor.

18. A method according to claim 16, wherein the circuit element has, at least in the low temperature range, a nonlinear voltage behavior with the temperature.

19. A method according to claim 16, wherein the first resistor of the voltage divider has a value adjusted as a function of the linearity error of the reference voltage generator, so as to obtain a voltage substantially linear with the temperature at the output terminal.

20. A method according to claim 19, wherein the reference voltage generator delivers a voltage substantially linear with the temperature.

21. A method according to claim 16, wherein the circuit element comprises at least one bipolar transistor connected in series with the first resistor of the voltage divider, the at least one bipolar transistor being polarized so as to function under saturation conditions for temperatures equal to or higher than the temperatures of the low temperature range.

22. A method according to claim 21, further comprising connecting a power supply to a base of the bipolar transistor for fixing an operating point of the transistor.

23. A method according to claim 16, wherein the low temperature range is between −60° C. and +25° C.

* * * * *